United States Patent [19]
Kim et al.

[11] Patent Number: 5,464,783
[45] Date of Patent: Nov. 7, 1995

[54] OXYNITRIDE-DIOXIDE COMPOSITE GATE DIELECTRIC PROCESS FOR MOS MANUFACTURE

[75] Inventors: Young O. Kim, Marlboro; Lalita Manchanda, Aberdeen; Gary R. Weber, Whitehouse Station, all of N.J.

[73] Assignee: AT&T Corp., Murray Hill, N.J.

[21] Appl. No.: 382,956

[22] Filed: Feb. 2, 1995

Related U.S. Application Data

[63] Continuation of Ser. No. 36,585, Mar. 24, 1993, abandoned.

[51] Int. Cl.[6] .................................................. H01L 21/8234
[52] U.S. Cl. .............................. 437/42; 437/239; 437/913; 437/920; 437/978; 148/DIG. 43
[58] Field of Search ............................. 437/42, 920, 978; 148/DIG. 43

[56] References Cited

U.S. PATENT DOCUMENTS

| | | |
|---|---|---|
| 3,558,348 | 1/1971 | Rand . |
| 3,765,935 | 10/1973 | Rand et al. . |
| 4,363,868 | 12/1892 | Takasaki et al. ................ 437/238 |
| 4,438,157 | 3/1984 | Romano-Moran ............... 437/42 |
| 4,490,900 | 1/1985 | Chiu ................................. 437/244 |
| 4,581,622 | 4/1986 | Takasaki et al. ............ 148/DIG. 43 |
| 4,725,560 | 2/1988 | Abernathey et al. ............ 437/247 |
| 4,851,370 | 7/1989 | Doklan et al. . |
| 4,937,756 | 6/1990 | Hsu et al. . |
| 4,980,307 | 11/1990 | Ito et al. . |
| 4,980,307 | 11/1990 | Ito et al. . |
| 5,013,692 | 5/1991 | Ide et al. ......................... 437/242 |
| 5,063,431 | 11/1991 | Ohshima . |
| 5,198,392 | 3/1993 | Fukuda et al. .................. 437/241 |
| 5,210,056 | 5/1993 | Pong et al. ...................... 437/983 |
| 5,219,773 | 6/1993 | Dunn ............................... 437/42 |
| 5,244,843 | 9/1993 | Chau et al. ...................... 437/983 |

OTHER PUBLICATIONS

S. M. Sze, "VLSI Technology", 1983, pp. 149–150.
Sharma et al; "Vertically Scaled High Reliability EEPROM with Ultra Thin Oxynitride Film Prepared by RTP in $N_2O/O_2$ Ambient", IEDM Apr. 1992, pp. 461–464.
T. Morimoto et al., "Effects of boron penetration and resultant limitations in ultra thin pure-oxide and nitrided-oxide gate-films," IEEE 1990, 90-429—90-432.
A. Uchiyama, et al., "High Performance Dual-gate Sub-halfmicron CMOSFETs with 6nm-thick Nitrided $SiO_2$ Films in an $N_2O$ Ambient," IEEE, 1990, 90-425-90-428.

Primary Examiner—Brian E. Hearn
Assistant Examiner—Michael Trinh
Attorney, Agent, or Firm—Martin I. Finston

[57] ABSTRACT

A method for making gate dielectrics for MOS devices includes first forming a silicon oxynitride layer, and then forming a silicon dioxide layer that underlies the oxynitride layer. The oxynitride layer functions as a membrane for controlled diffusion of oxygen to the oxidation region of the silicon substrate.

9 Claims, 2 Drawing Sheets

OXYNITRIDE-DIOXIDE COMPOSITE GATE DIELECTRIC PROCESS FOR MOS MANUFACTURE

This application is a continuation of application Ser. No. 08/036585, filed on Mar. 24, 1993, now abandoned.

FIELD OF THE INVENTION

The invention relates to methods for manufacturing MOS integrated circuits. More particularly, the invention relates to methods for forming gate dielectric layers that contain oxynitrides of silicon.

ART BACKGROUND

There is increasing interest in MOS integrated circuits in which the component devices have gate dimensions as small as 0.25 µm or even less. Devices having such small dimensions suffer from certain problems that are not of serious concern when the gate dimensions are 1 µm or more. For example, the scaling rules that apply to these small devices call for very thin gate oxide layers, typically equivalent to 30 Å–70 Å of silicon dioxide. Conventional gate oxide layers, which consist of thermally grown silicon dioxide, may be inadequate in several respects when they are made this thin.

For example, such thin oxide layers tend to exhibit a high density of pinholes. These layers are also very permeable to boron. As a result, boron from a $p^+$-doped polysilicon gate electrode can readily penetrate the thin oxide layer and contaminate the underlying channel during subsequent, high-temperature processing.

Difficulties also arise in the fabrication of these thin silicon dioxide layers. That is, these layers are conventionally grown at temperatures greater than 900° C., and typically 1000° C. or more. The ability to control the thickness of these layers depends on the growth rate. In general, oxidation at these temperatures proceeds so quickly that it is difficult to assure that the resulting layer will have a uniform thickness. The oxidation rate can, of course, be decreased by reducing the temperature to, e.g., 900° C. or less. However, the resulting films tend to have large compressive stress that enhances the accumulation of electric charge at the semiconductor interface, and may also enhance current leakage.

It is known that silicon oxynitride films are less permeable to diffusing boron atoms than silicon dioxide films. Silicon oxynitride films have, in fact, been made for use as gate dielectrics. However, the interfaces between these films and the underlying semiconductor are generally of poor quality, as evidenced by low carrier mobilities in the resulting device channels. Moreover, these films must generally be made at a relatively high reaction temperature, resulting in poor control over film thickness, as discussed above.

To solve at least some of these problems, several investigators have proposed the use of composite dielectric films that include a layer of silicon dioxide as well as a layer of silicon oxynitride. These composite films are made by thermally growing a thin layer of silicon dioxide, and then forming a layer of silicon oxynitride or silicon nitride by chemical vapor deposition (CVD). However, these approaches do not solve the problem of controlling the thickness of the silicon dioxide film. Moreover, they may result in a relatively high fixed charge at the semiconductor-dielectric interface, and they may result in an interface of poor quality.

U.S. Pat. No. 4,621,277, issued to T. Ito et al. on Nov. 4, 1986, describes a silicon nitride or oxynitride gate dielectric made in three stages. First, the silicon surface is subjected to direct thermal nitridation. The resulting nitride film is then at least partially oxidized. Further growth of the film occurs during this oxidation stage. In the last stage, the oxidized film is subjected to direct thermal nitridation. Penetration of the oxidized film by nitrogen atoms during this stage leads to further nitridation of the silicon surface.

Although the Ito process reportedly yields a dielectric of high quality, it results in a nitride or oxynitride region, and not a silicon dioxide region, at the semiconductor interface. Moreover, this method may reduce mobility at the semiconductor-dielectric interface.

Thus, practitioners have hitherto failed to provide a dielectric that combines the advantages of silicon oxynitride with the desirable interfacial properties of silicon dioxide, while preserving high quality and tight control over film thickness.

SUMMARY OF THE INVENTION

We have developed a method for forming gate dielectric layers that include a layer of silicon oxynitride underlain by a layer that comprises silicon dioxide. These dual layers have good integrity and form interfaces of good quality with the underlying substrate. Because the oxynitride component layer retards the diffusion of oxygen toward the region of oxide growth, the component silicon dioxide layer can be grown relatively slowly even at relatively high temperatures. As a result, it is possible to grow this layer with a uniform thickness. The oxynitride layer is also effective for retarding the diffusion of boron from, e.g., an overlying polysilicon gate electrode.

Accordingly, the invention, in a broad sense, is a method for manufacturing at least one MOS device on a silicon substrate. The method includes the steps of forming a dielectric layer adjacent a surface of the substrate, and depositing a gate electrode layer on the dielectric layer. In contrast to methods of the prior art, the dielectric layer is a dual layer formed by first forming a layer of silicon oxynitride, and then oxidizing a surface layer of the substrate such that a layer comprising silicon dioxide is formed adjacent and underlying the silicon oxynitride layer.

DETAILED DESCRIPTION

Figure 1:
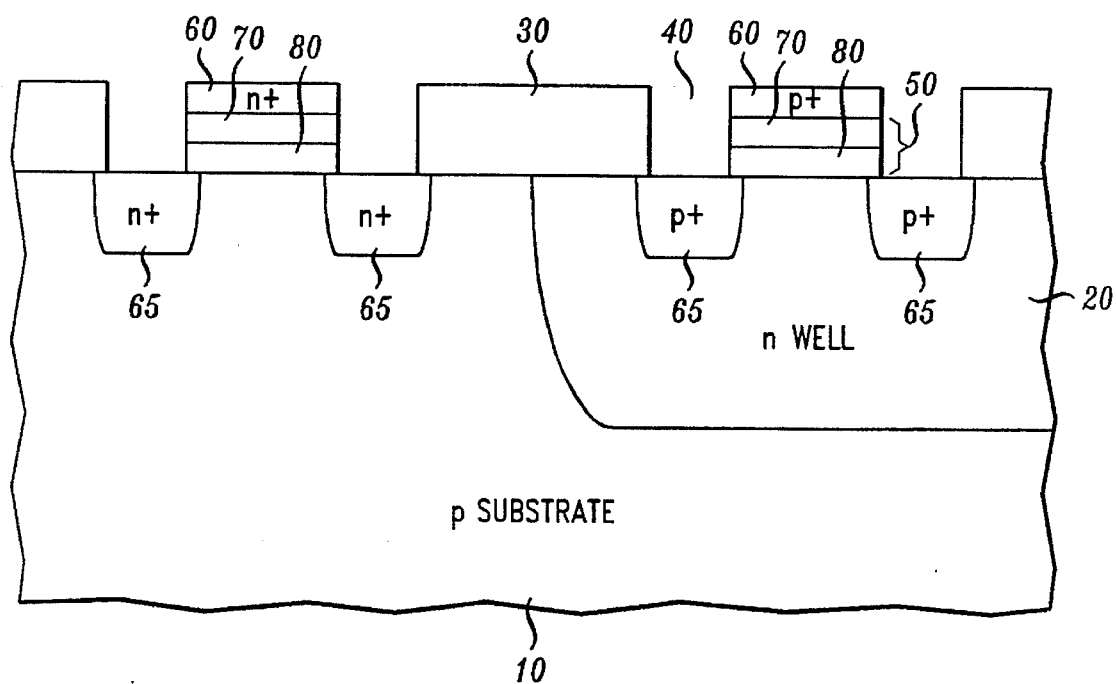
FIG. 1 is a schematic, sectional view of two transistors of a CMOS integrated circuit made according to the invention, in one embodiment.

With reference to FIG. 1, an illustrative procedure for manufacturing, e.g., a CMOS integrated circuit is now described. First, a p-type [100] silicon wafer 10 having a pattern of n-type wells 20 adjacent a principal surface is provided. (These characteristics are illustrative only, and not limiting. For example, the invention is readily practiced with n-type wafers and with [111] wafers.) A field oxide layer 30 is conventionally deposited on the surface and patterned to define one or more windows 40 where transistors are to be formed. Within each window, the dual gate dielectric layer 50 is formed according to methods described in detail below. A polysilicon layer 60 is then conventionally deposited and patterned to form the gate contacts and concurrently, to define the source and drain regions 65. The gate contacts and source and drain regions are then doped by conventional methods. According to one such method, oxide sidewalls are foraged adjacent the gate region, silicide layers are formed at the source, drain, and polysilicon gate surfaces, the silicide layers are doped by ion implantation (of, e.g., boron or phosphorus), and source and drain regions 65 are activated by thermal diffusion of dopant from the relevant silicide layers.

The inventive method will be particularly useful for making transistors (or other MOS devices, such as MOS capacitors) having gate dimensions in the approximate range 0.1–0.25 μm. For devices of this class, the thickness of the silicon oxynitride layer 70 is desirably in the approximate range 30 Å–70 Å, (thicknesses as high as 100 Å or more will be acceptable for some applications) and the thickness of the silicon dioxide gate layer 80 is desirably in the approximate range 5 Å–15 Å (thicknesses as high as about 30 Å may be acceptable for some applications).

It is well known that the composition of silicon oxynitride is variable, depending on the conditions under which it was formed. For MOS devices made by the inventive method, it is desirable for the atomic concentration [N] of nitrogen and the atomic concentration of oxygen [O] immediately after formation of the oxynitride layer to stand in a ratio, denoted N/O, that is at least about 0.1 but not more than about 0.4. A ratio of about 0.2 is currently preferred, because it affords the greatest control over oxygen diffusion. The silicon oxynitride layer is readily grown by chemical vapor deposition from an atmosphere that contains nitrogen and oxygen in suitable, gaseous, chemical forms, and further contains at least one gaseous compound of silicon. An exemplary such atmosphere contains ammonia, nitrous oxide, and a gaseous silicon compound.

In an alternative procedure, the oxynitride layer is formed by reacting a surface layer of the silicon substrate, in situ, with an appropriate atmosphere. An exemplary such atmosphere contains nitrous oxide or nitric oxide.

It should be noted in this regard that N/O will generally decrease during the oxidation step that leads to formation of the silicon dioxide layer. Typically, N/O will change from about 10% to about 4–5%.

According to a currently preferred procedure, the oxynitride layer is deposited by CVD from an atmosphere consisting of dichlorosilane ($SiH_2Cl_2$), ammonia, and nitrous oxide ($N_2O$). An appropriate CVD technique is described generally in U.S. Pat. No. 3,558,348, issued to M. J. Rand on Jan. 26, 1971, and in U.S. Pat. No. 3,765,935, issued to M. J. Rand et al. on Oct. 16, 1973. In accordance with this technique, the reactant vapors are diluted in an appropriate carrier gas and flowed through the CVD reactor. The composition of the film is controlled by controlling the reaction temperature and the relative concentration of each reactant vapor in the reaction chamber. In particular, the value of N/O is determined by the ratio of the ammonia and nitrous oxide concentrations.

For example, we have deposited a silicon oxynitride film at a rate of about 1 Å per minute in a standard, hot wall, horizontal LPCVD reactor. The deposition was carried out at a temperature of 800° C. and a pressure of about 13 Pa. The flow rates of the reactant gases were: ammonia, 3 SCCM; dichlorosilane, 36 SCCM; and nitrous oxide, 65 SCCM.

After the oxynitride layer is formed, the silicon dioxide layer is grown. This is done by exposing the substrate to an oxidizing atmosphere at a sufficiently high temperature. An exemplary oxidizing atmosphere contains oxygen, or, alternatively, nitrous oxide ($N_2O$). A temperature of at least about 900° C. is desirable in order to avoid compressive stress in the resulting oxide layer, and a temperature of at least about 950° C. is currently preferred.

The silicon dioxide layer can be grown by several different methods, including rapid thermal oxidation and furnace oxidation. This step can be carried out in the same reactor used for oxynitride formation, or in a different reactor. It may be advantageous in at least some cases to use the same reactor, in order to minimize handling of the substrate. By way of example, we have formed the oxynitride layer by rapid thermal oxidation in a pure oxygen ambient.

Figure 2:
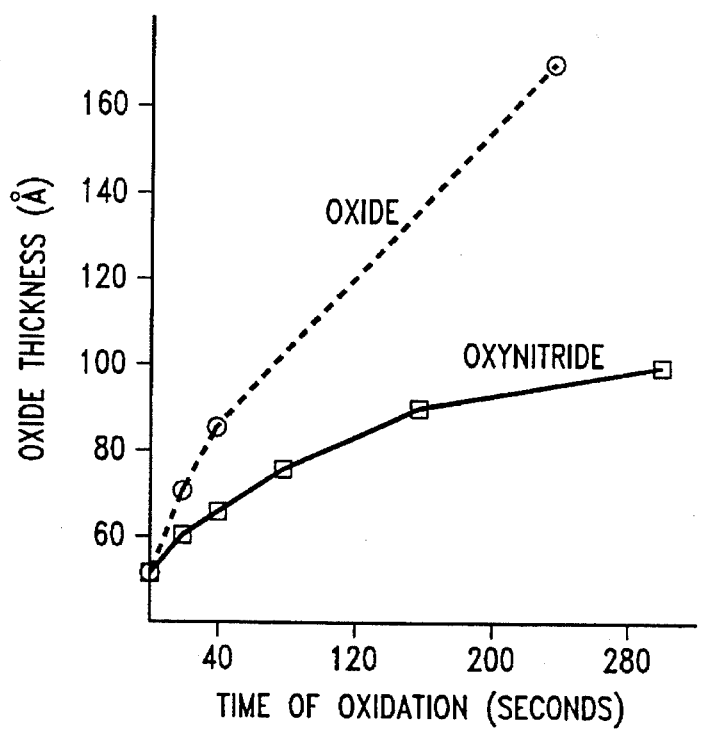
FIG. 2 is a graph of oxide thickness versus oxidation time for two cases. One case is oxidation through an overlayer of silicon oxynitride, according to the invention. The other case is oxidation through a comparably thick overlayer of silicon dioxide.

The oxynitride layer substantially reduces the oxidation rate, relative to a silicon substrate that is bare or overlain by a silicon dioxide layer comparable in thickness to the oxynitride layer. This is demonstrated by FIG. 2, which shows the relationship between oxide thickness and oxidation time for two cases of oxidation at 950° C.: through a 50 Å silicon oxynitride overlayer (N/O=0.2) and through a 52 Å silicon dioxide overlayer.

EXAMPLE I

We made MOS capacitors having an aluminum or $n^+$-doped polysilicon gate. For purposes of comparison, we made capacitors having a single-layer silicon oxynitride dielectric, and other capacitors having a dual-layer dielectric of comparable thickness, as described above. In both cases, the oxynitride layer was grown at 950° C., with N/O equal to 0.2. High-resolution transmission electron microscopy showed that the interfacial quality was superior for the dual-layer dielectrics. The fixed charge density for the single-layer capacitors was $-3 \times 10^{11}$ cm$^{-2}$, and for the dual-layer capacitors it ranged from $5 \times 10^{10}$ cm$^{-2}$ to $8 \times 10^{10}$ cm$^{-2}$. This may imply that the single layers are in tensile stress at the silicon interface, whereas the dual layers are in compressive stress at that interface. MOS capacitors having a single, 60 Å silicon dioxide dielectric layer had a fixed charge density of $1.5 \times 10^{11}$ cm$^{-2}$, implying a compressive stress.

Figure 3:
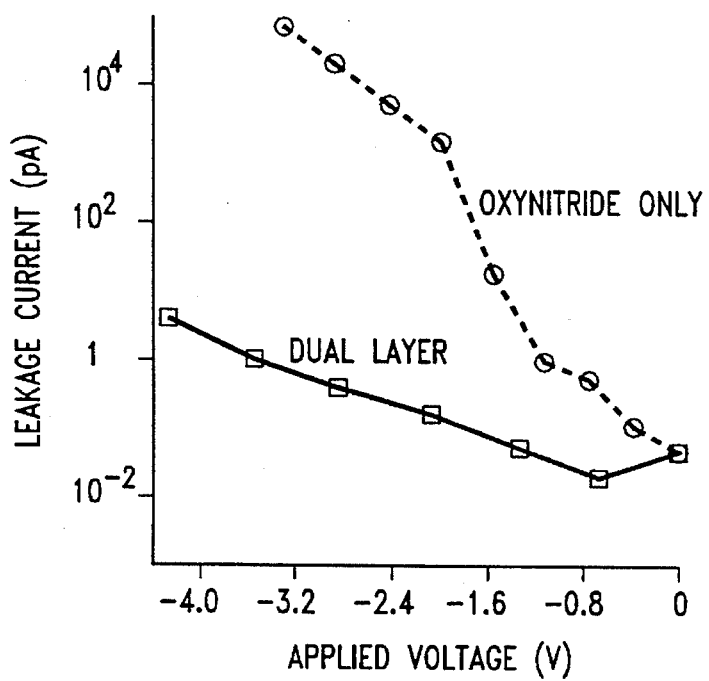
FIG. 3 is a graph of leakage current in a gate dielectric layer versus voltage, for two cases. One case is a dual-layer dielectric, according to the invention. The other case is a single-layer, oxynitride dielectric of comparable thickness.

FIG. 3 shows the leakage current characteristics of 46 Å single-layer dielectrics and 63 Å dual-layer dielectrics having a surface area of $4 \times 10^{-4}$ cm$^{-2}$. It is clear that the leakage current is smaller for the dual layer at every applied voltage. In particular, at an applied field of 3 MV/cm, the leakage current is $2 \times 10^{-8}$ A-cm$^{-2}$ for the single layer, but only $5 \times 10^{-10}$ A-cm$^{-2}$ for the dual layer. Accordingly, it is clear that at this applied field, a leakage current less than 1 nA/cm$^2$ is readily attainable using the dual-layer dielectric. At the same applied field, a single, 60 Å dielectric layer of silicon dioxide exhibited a leakage current of $5 \times 10^{-10}$ A-cm$^{-2}$, roughly the same as the dual layer.

EXAMPLE II

We made PMOS transistors having $p^+$-doped polysilicon gates. One group of transistors had 63 Å, dual-layer gate dielectrics as described above. The other group had 60 Å, silicon dioxide dielectrics. We subjected the dual-layer transistors to thermal cycling to determine whether boron in the polysilicon gate would diffuse through the gate dielectric layer and increase the threshold voltage. One group of transistors was held at 800° C. for 60 minutes. A second group was held at 800° C. for 60 minutes and then at 850° C. for 60 minutes. We observed no difference in threshold voltage between the two groups. This implied that there was no significant penetration of boron through the gate dielectric layer and into the substrate.

We claim:

1. Method for making an MOS integrated circuit of the kind in which at least one transistor has a composite gate dielectric comprising a substantially silicon dioxide layer overlain by a silicon oxynitride layer, the method comprising:

a) forming a dielectric layer on a principal surface of a silicon substrate;

b) depositing a gate electrode layer over the dielectric layer;

c) patterning the gate electrode layer, thereby to define at least one gate contact; and d) doping a source region and a drain region in substrate portions that lie adjacent the gate contact, CHARACTERIZED IN THAT the step of forming a dielectric layer further comprises:

e) forming a silicon oxynitride layer having a thickness in the range 30Å–100Å; and f) then subjecting the substrate to an oxidizing atmosphere such that chemical species comprising oxygen migrate through the oxynitride layer to a surface layer of the substrate and react therewith, resulting in the growth of a substantially silicon dioxide layer having a thickness in the range 5 Å–30 Å adjacent and underlying the silicon oxynitride layer, thereby to form said composite gate dielectric.

2. The method of claim 1, wherein (e) is carried out by chemical vapor deposition from an atmosphere comprising a gaseous compound of silicon and a gaseous compound of nitrogen and oxygen.

3. The method of claim 2, wherein the atmosphere comprises ammonia ($NH_3$), nitrous oxide ($N_2O$), and dichlorosilane ($SiH_2Cl_2$).

4. The method of claim 1, wherein (e) is carried out by reacting a surface layer of the substrate in an atmosphere that comprises nitrous oxide ($N_2O$).

5. The method of claim 1, wherein (f) is carried out at a temperature of at least 900° C.

6. The method of claim 1, wherein the oxynitride layer has a ratio, averaged thereover, of nitrogen atomic concentration to oxygen atomic concentration, and (e) is carried out such that said ratio is at least 10%, but not more than 40%.

7. The method of claim 6, wherein the ratio is about 20%.

8. The method of claim 1, wherein step (d) comprises the further steps of:

forming a dopant diffusion source layer by implanting boron ions in the gate electrode layer and the source and drain regions; and heating the substrate such that boron in the source and drain regions is diffused, whereby the source and drain regions are activated; and steps (e) and (f) are carried out such that during the heating step, no significant amount of boron diffuses from the gate electrode layer through the dielectric layer and into the substrate.

9. The method of claim 1, wherein (e) is carded out by reacting a surface layer of the substrate in an atmosphere that comprises nitric oxide (NO).

\* \* \* \* \*